(12) United States Patent
Xia

(10) Patent No.: US 12,075,705 B2
(45) Date of Patent: Aug. 27, 2024

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Wen Bin Xia, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 326 days.

(21) Appl. No.: 17/394,341

(22) Filed: Aug. 4, 2021

(65) Prior Publication Data
US 2022/0045268 A1    Feb. 10, 2022

(30) Foreign Application Priority Data

Aug. 5, 2020 (CN) .......................... 202010779496.2

(51) Int. Cl.
| | |
|---|---|
| *H10N 50/01* | (2023.01) |
| *G01R 33/00* | (2006.01) |
| *G01R 33/09* | (2006.01) |
| *G11C 11/16* | (2006.01) |
| *G11C 11/56* | (2006.01) |
| *H10B 61/00* | (2023.01) |
| *H10N 50/10* | (2023.01) |
| *H10N 50/80* | (2023.01) |
| *H10N 50/85* | (2023.01) |

(52) U.S. Cl.
CPC .......... *H10N 50/01* (2023.02); *G01R 33/093* (2013.01); *G11C 11/161* (2013.01); *G11C 11/5607* (2013.01); *H10B 61/00* (2023.02); *H10N 50/10* (2023.02); *H10N 50/80* (2023.02); *H10N 50/85* (2023.02); *G01R 33/0052* (2013.01); *G01R 33/098* (2013.01)

(58) Field of Classification Search
None
See application file for complete search history.

(56) References Cited

U.S. PATENT DOCUMENTS

| | | | | |
|---|---|---|---|---|
| 9,735,343 | B2 * | 8/2017 | Higo | G11C 11/16 |
| 10,319,901 | B2 * | 6/2019 | Sasaki | G11C 11/161 |
| 10,636,875 | B1 * | 4/2020 | Chou | H01L 29/7785 |
| 11,276,815 | B2 * | 3/2022 | Sasaki | H10N 50/85 |
| 11,532,323 | B1 * | 12/2022 | Le | H01F 10/30 |

(Continued)

*Primary Examiner* — Kevin M Bernatz
(74) *Attorney, Agent, or Firm* — Anova Law Group, PLLC

(57) ABSTRACT

A semiconductor structure and a fabrication method thereof. The semiconductor structure, includes: a substrate; and magnetic tunnel junctions on the substrate, that each magnetic tunnel junction of the magnetic tunnel junctions includes a first region and a second region adjacent to the first region, each magnetic tunnel junction includes a multilayered material including material layers stacked along a normal direction of the substrate, and the material layers of each magnetic tunnel junction include at least one layer that is different in the first region and the second region. The storage capacity density of the semiconductor structure is high.

16 Claims, 8 Drawing Sheets

(56) References Cited

U.S. PATENT DOCUMENTS

| | | | | |
|---|---|---|---|---|
| 2013/0069186 | A1* | 3/2013 | Toko | H10N 50/85 257/E27.005 |
| 2013/0175644 | A1* | 7/2013 | Horng | B82Y 40/00 257/E29.323 |
| 2015/0069560 | A1* | 3/2015 | Cho | G11C 11/161 257/421 |
| 2017/0005136 | A1* | 1/2017 | Wiegand | H10B 61/00 |
| 2017/0077388 | A1* | 3/2017 | Tsubata | H10N 50/01 |
| 2018/0277517 | A1* | 9/2018 | Kim | H10B 61/22 |
| 2019/0067563 | A1* | 2/2019 | Komura | G01R 33/098 |
| 2019/0103554 | A1* | 4/2019 | Aggarwal | H10B 61/00 |
| 2019/0123263 | A1* | 4/2019 | Park | H10N 50/85 |
| 2019/0279699 | A1* | 9/2019 | Ohsawa | H10N 50/10 |
| 2020/0091412 | A1* | 3/2020 | Lee | H10N 50/80 |
| 2020/0152251 | A1* | 5/2020 | Kim | H10N 50/85 |
| 2020/0313075 | A1* | 10/2020 | Sato | G11C 11/161 |
| 2021/0063505 | A1* | 3/2021 | Mauri | H10N 50/01 |
| 2021/0135098 | A1* | 5/2021 | Gallagher | H10B 61/00 |
| 2021/0296577 | A1* | 9/2021 | Kim | H10N 50/10 |
| 2022/0068537 | A1* | 3/2022 | Mizuno | G01R 33/093 |
| 2024/0107891 | A1* | 3/2024 | Aggarwal | H10B 61/22 |

\* cited by examiner

SEMICONDUCTOR STRUCTURE AND FABRICATION METHOD THEREOF

CROSS-REFERENCE TO RELATED APPLICATION

This application claims the priority of Chinese Patent Application No. 202010779496.2, filed on Aug. 5, 2020, the content of which is incorporated herein by reference in its entirety.

TECHNICAL FIELD

The present disclosure generally relates to the field of semiconductor manufacturing and, more particularly, to a semiconductor structure and a fabrication method thereof.

BACKGROUND

An MRAM (i.e., Magnetic Random-Access Memory) is a non-volatile magnetic random-access memory. The MRAM has high-speed read and write capabilities of a static random-access memory (SRAM), high integration of a dynamic random-access memory (DRAM), and power consumption much lower than the DRAM. Compared with a flash memory (Flash), performance of the MRAM is less degraded as use time increases. Due to the above-mentioned characteristics, the MRAM is regarded as a universal memory and is considered to be able to replace the SRAM, the DRAM, an electrically erasable programmable read-only memory (EEPROM), and the Flash.

Different from existing random-access memory chip manufacturing technologies, data in the MRAM is not stored in a form of an electric charge or an electric current, but is stored in a magnetic state, which is sensed by measuring a resistance without disturbing the magnetic state. The MRAM uses a magnetic tunnel junction (MTJ) structure for data storage. An MRAM cell may include a transistor (1T) and a magnetic tunnel junction (MTJ) to form a memory cell. The MTJ structure at least includes two electromagnetic layers and an insulating layer for isolating the two electromagnetic layers. Electric current vertically flows or "passes" from one of the two electromagnetic layers to another of the two electromagnetic layers through the insulating layer. One of the two electromagnetic layers is a fixed magnetic layer, which fixes an electrode in one alternative direction through a strong fixed field. Another of the two electromagnetic layers is a freely rotatable magnetic layer, which holds an electrode in one of alternative directions.

However, there is a need to improve capacity density of a conventionally formed MRAM.

SUMMARY

One aspect of the present disclosure provides a semiconductor structure, including: a substrate; and magnetic tunnel junctions on the substrate, that each magnetic tunnel junction of the magnetic tunnel junctions includes a first region and a second region adjacent to the first region, each magnetic tunnel junction includes a multilayered material including material layers stacked along a normal direction of the substrate, and the material layers of each magnetic tunnel junction include at least one material layer that is different in the first region and the second region.

Optionally, the at least one material layer is different in physical properties and/or chemical properties in the first region and the second region.

Optionally, the multilayered material includes: a first electromagnetic layer, an insulating layer over the first electromagnetic layer, and a second electromagnetic layer over the insulating layer.

Optionally, a thickness of the first electromagnetic layer in the first region is different from a thickness of the first electromagnetic layer in the second region.

Optionally, a roughness of the first electromagnetic layer in the first region is different from a roughness of the first electromagnetic layer in the second region.

Optionally, the first electromagnetic layer in the first region is made of a material including cobalt iron boron, and the first electromagnetic layer in the second region is made of a material including cobalt iron boron doped with first modifying ions, the first modifying ions including titanium ions, tantalum ions, or a combination thereof.

Optionally, a thickness of the insulating layer in the first region is different from a thickness of the insulating layer in the second region.

Optionally, a roughness of the insulating layer in the first region is different from a roughness of the insulating layer in the second region.

Optionally, the insulating layer in the first region is made of a material including magnesium oxide, and the insulating layer in the second region is made of a material including magnesium oxide doped with second modifying ions, the second modifying ions including nitrogen ions, magnesium ions, or a combination thereof.

Optionally, a thickness of the second electromagnetic layer in the first region is different from a thickness of the second electromagnetic layer in the second region.

Optionally, a roughness of the second electromagnetic layer in the first region is different from a roughness of the second electromagnetic layer in the second region.

Optionally, the second electromagnetic layer in the first region is made of a material including cobalt iron boron, and the second electromagnetic layer in the second region is made of a material including cobalt iron boron doped with third modifying ions, the third modifying ions including titanium ions, tantalum ions, or a combination thereof.

Optionally, the multilayered material further includes: a seed layer under the first electromagnetic layer.

Optionally, a thickness of the seed layer in the first region is different from a thickness of the seed layer in the second region.

Optionally, a roughness of the seed layer in the first region is different from a roughness of the seed layer in the second region.

Optionally, the seed layer in the first region is made of a material including cobalt iron boron, and the seed layer in the second region is made of a material including cobalt iron boron doped with fourth modifying ions, the fourth modifying ions including titanium ions, tantalum ions, or a combination thereof.

Optionally, the multilayered material further includes: an optimized layer over the second electromagnetic layer.

Optionally, a thickness of the optimized layer in the first region is different from a thickness of the optimized layer in the second region.

Optionally, a roughness of the optimized layer in the first region is different from a roughness of the optimized layer in the second region.

Optionally, the optimized layer in the first region is made of a material including cobalt iron boron, and the optimized layer in the second region is made of a material including cobalt iron boron doped with fifth modifying ions, the fifth modifying ions including nitrogen ions, magnesium ions, or a combination thereof.

Optionally, the multilayered material further includes: a lower electrode layer under the first electromagnetic layer, and an upper electrode layer over the second electromagnetic layer.

Optionally, a thickness of the lower electrode layer in the first region is different from a thickness of the lower electrode layer in the second region.

Optionally, a roughness of the lower electrode layer in the first region is different from a roughness of the lower electrode layer in the second region.

Optionally, the lower electrode layer of the first region is made of a material including a metal, and the lower electrode layer of the second region is made of a material including a metal doped with sixth modifying ions, the sixth modifying ions including titanium ions, tantalum ions, or a combination thereof.

Optionally, a thickness of the upper electrode layer in the first region is different from a thickness of the upper electrode layer in the second region.

Optionally, a roughness of the upper electrode layer in the first region is different from a roughness of the upper electrode layer in the second region.

Optionally, the upper electrode layer of the first region is made of a material including a metal, and the upper electrode layer of the second region is made of a material including a metal doped with seventh modifying ions, the seventh modifying ions including titanium ions, tantalum ions, or a combination thereof.

Optionally, each or one of the magnetic tunnel junctions further includes: a third region adjacent to the first region and the second region, and the material layers of the magnetic tunnel junction include at least one material layer that is different in the first, second, and/or third regions.

Another aspect of the present disclosure provides a method for forming a semiconductor structure, including: providing a substrate; and forming magnetic tunnel junctions on the substrate, that each magnetic tunnel junction of the magnetic tunnel junctions includes a first region and a second region adjacent to the first region, each magnetic tunnel junction includes a multilayered material including material layers stacked along a normal direction of the substrate, and the material layers of each magnetic tunnel junction include at least one material layer that is different in the first region and the second region.

Optionally, the multilayered material includes: a first electromagnetic layer, an insulating layer over the first electromagnetic layer, and a second electromagnetic layer over the insulating layer.

Optionally, the substrate includes a plurality of initial first regions and an initial second region between adjacent initial first regions, the initial second region being adjacent to an initial first region; and a method for forming the multilayered material includes: forming a first electromagnetic material film on the plurality of initial first regions and the initial second region; forming an insulating material film on the first electromagnetic material film; forming a second electromagnetic material film on the insulating material film; and using a patterning process to etch the first electromagnetic material film, the insulating material film, and the second electromagnetic material film until a surface of the substrate is exposed, thereby forming the magnetic tunnel junctions on the substrate, that a first region of each of the magnetic tunnel junctions is located on a portion of one of the plurality of initial first regions, a second region of each of the magnetic tunnel junctions is located on a portion of the initial second region, and each of the magnetic tunnel junctions includes: a first electromagnetic layer, an insulating layer over the first electromagnetic layer, and a second electromagnetic layer over the insulating layer.

Optionally, a method of the patterning process includes: forming a first patterned layer on the second electromagnetic material film, that the first patterned layer exposes a portion of the second electromagnetic material film; and using the first patterned layer as a mask, to etch the first electromagnetic material film, the insulating material film, and the second electromagnetic material film until the surface of the substrate is exposed.

Optionally, the method for forming the multilayered material further includes: performing a modification treatment to at least one of the first electromagnetic material film, the insulating material film, or the second electromagnetic material film.

Optionally, a method of the modification treatment includes: forming a second patterned layer on the first electromagnetic material film, that the second patterned layer exposes a surface of the first electromagnetic material film; and using the second patterned layer as a mask to perform the modification treatment to the first electromagnetic material film.

Optionally, a method of the modification treatment includes: forming a third patterned layer on the insulating material film, that the third patterned layer exposes a surface of the insulating material film on the plurality of initial first regions or the initial second region; and using the third patterned layer as a mask to perform the modification treatment to the insulating material film.

Optionally, a method of the modification treatment includes: forming a fourth patterned layer on the second electromagnetic material film, that the fourth patterned layer exposes a surface of the second electromagnetic material film; and using the fourth patterned layer as a mask to perform the modification treatment to the second electromagnetic material film.

Optionally, the modification treatment includes: a physical modification, a chemical modification, or a combination thereof.

Optionally, a method of the physical modification includes a plasma etching process.

Optionally, a method of the physical modification includes a chemical etching process.

Optionally, a method of the chemical modification includes a plasma doping treatment, and doping ions include titanium ions, magnesium ions, nitrogen ions, magnesium ions, or a combination thereof.

Optionally, a method of the chemical modification includes a chemical solution treatment.

Optionally, the method for forming the multilayered material further includes: before forming the first electromagnetic material film, forming a seed material film on the substrate, that the seed material film is also etched during the patterning process, to form a seed layer in the first region and the second region.

Optionally, the method for forming the multilayered material further includes: after forming the seed material film and before the patterning process, performing a modification treatment to the seed material film so that the seed material film on the plurality of initial first regions is different from the seed material film on the initial second region.

Optionally, the method for forming the multilayered material further includes: after forming the second electromagnetic material film, forming an optimized material film on the second electromagnetic material film, that the optimized material film is also etched during the patterning process to form an optimized layer in the first region and the second region.

Optionally, the method for forming the multilayered material further includes: after forming the optimized material film and before the patterning layer process, performing a modification treatment to the optimized material film, so that the optimized material film on the plurality of initial first regions is different from the optimized material film on the initial second region.

Optionally, the method for forming the multilayered material further includes: before forming the first electromagnetic material film, forming a lower electrode material film on the substrate; and after forming the second electromagnetic material film, forming an upper electrode material film on the second electromagnetic material film, that the lower electrode material film and the upper electrode material film are also etched during the patterning process to form a lower electrode layer and an upper electrode layer in the first region and the second region, that the lower electrode layer is under the first electromagnetic layer, and the upper electrode layer is over the second electromagnetic layer.

Optionally, the method for forming the multilayered material further includes: performing a modification treatment to the lower electrode material film, so that the lower electrode material film on the plurality of initial first regions is different from the lower electrode material film on the initial second region.

Optionally, the method for forming the multilayered material further includes: performing a modification treatment to the upper electrode material film, so that the upper electrode material film on the plurality of initial first regions is different from the upper electrode material film on the initial second region.

Optionally, each or one of the magnetic tunnel junctions further includes: a third region adjacent to the first region and the second region, and the material layers of the magnetic tunnel junction include at least one material layer that is different in the first, second, and/or third regions.

Compared with the existing technology, the technical solutions of the present disclosure have the following beneficial effects.

In the semiconductor structure provided by the technical solutions of the present disclosure, since each of the magnetic tunnel junctions includes the first region and the second region adjacent to the first region, and the material layers of each magnetic tunnel junction include at least one material layer that is different in the first region and the second region, the multilayered material in the first region and the multilayered material in the second region have different high resistance values and low resistance values, respectively, and the magnetoresistance between the first region and the second region is connected in parallel, so that each of the magnetic tunnel junctions can form $2^n$ states (n is a natural number greater than 1), thereby effectively increasing the storage capacity of a memory cell, and increasing the storage capacity density of the formed semiconductor structure.

In the method for forming the semiconductor structure provided by the technical solutions of the present disclosure, the magnetic tunnel junctions are formed on the substrate. Each of the magnetic tunnel junctions includes the first region and the second region adjacent to the first region, and the material layers of each magnetic tunnel junction include at least one material layer that is different in the first region and the second region, so that the multilayered material in the first region and the multilayered material in the second region have different high resistance values and low resistance values, respectively, and the magnetoresistance between the first region and the second region is connected in parallel, so that each of the magnetic tunnel junctions can form $2^n$ states (n is a natural number greater than 1), thereby effectively increasing the storage capacity of the memory cell, and increasing the storage capacity density of the formed semiconductor structure.

BRIEF DESCRIPTION OF THE DRAWINGS

The following accompanying drawings are merely examples for illustrative purposes according to various disclosed embodiments and are not intended to limit the scope of the present disclosure.

FIGS. 3 to 18A-18B illustrate structures corresponding to certain stages during an exemplary fabrication process of a semiconductor structure consistent with various disclosed embodiments of the present disclosure.

DETAILED DESCRIPTION

Figure 1:
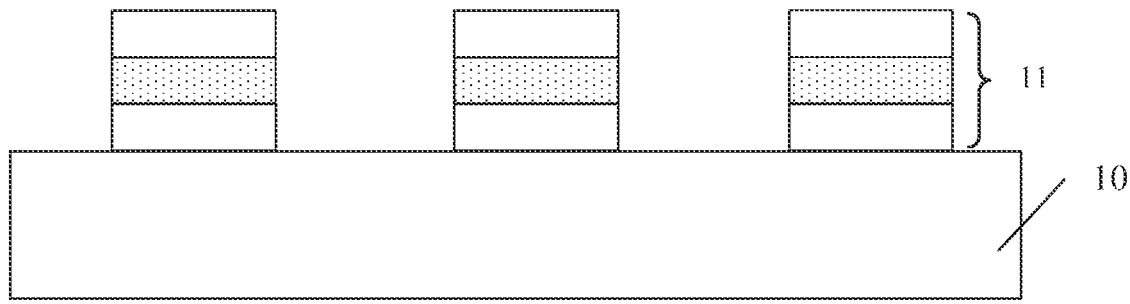
FIG. 1 is a schematic structural diagram of an existing semiconductor structure.

First, performance of existing semiconductor structures will be described in detail with reference to the accompanying drawings. FIG. 1 is a schematic structural diagram of an existing semiconductor structure.

Referring to FIG. 1, an existing semiconductor structure includes a substrate 10; and a number of magnetic tunnel junctions 11 on the substrate 10.

By reducing a distance between the magnetic tunnel junctions 11, the number of the magnetic tunnel junctions 11 in a certain area can be increased, thereby increasing storage capacity density of the formed semiconductor structure.

However, as requirements for integration of semiconductor devices become higher and higher, the distance between adjacent magnetic tunnel junctions 11 has become smaller. If the distance is further reduced, a limit of existing photolithography processes is easily exceeded, and difficulty of the processes is increased.

Figure 2:
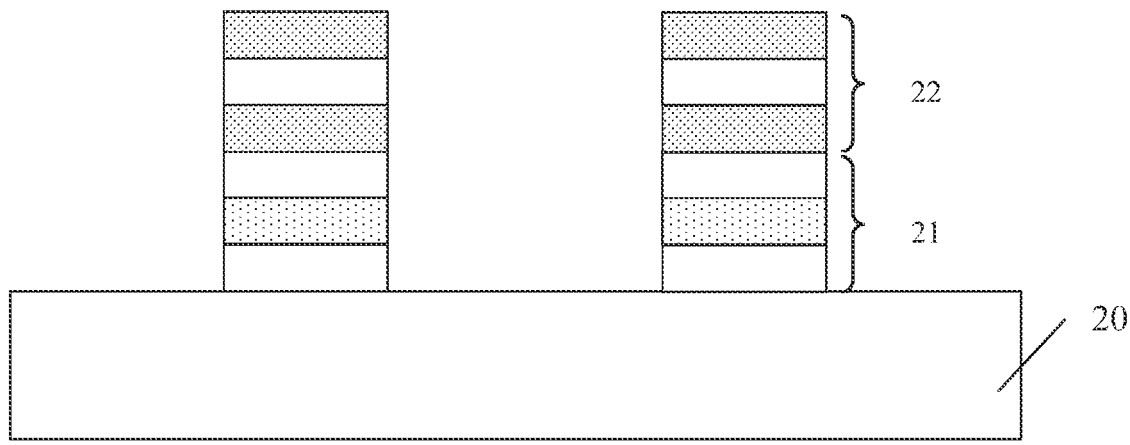
FIG. 2 is a schematic structural diagram of an existing semiconductor structure.

FIG. 2 is a schematic structural diagram of an existing semiconductor structure.

To solve the above problem, an existing semiconductor structure has been proposed. Referring to FIG. 2, the existing semiconductor structure includes: a substrate 20; and a first magnetic tunnel junction 21 and a second magnetic tunnel junction 22 on the substrate 20 overlapping in a normal direction of the substrate 20.

In the above structure, the first magnetic tunnel junction 21 and the second magnetic tunnel junction 22 are electrically connected to each other and can be used as a memory cell. In addition, the first magnetic tunnel junction 21 and the second magnetic tunnel junction 22 have different switching voltages, which increases the storage capacity of the memory cell. However, the first magnetic tunnel junction 21 and the second magnetic tunnel junction 22 are connected in series, resulting in a larger resistance of the first magnetic tunnel junction 21 and the second magnetic tunnel junction 22, and a stronger driving voltage is required, which leads to poor performance of the semiconductor structure.

To solve the above technical problems, the embodiments of the present disclosure provide a method for forming a semiconductor structure, including: providing a substrate; and forming magnetic tunnel junctions on the substrate, that each of the magnetic tunnel junctions includes a first region and a second region adjacent to the first region, each of the magnetic tunnel junctions includes a multilayered material including material layers stacked along a normal direction of the substrate, and the material layers of each magnetic tunnel junction include at least one material layer that is different in the first region and the second region, which is beneficial to increase the storage capacity density of the formed semiconductor structure.

To make the above objectives, features and beneficial effects of the present disclosure more obvious and understandable, alternative embodiments of the present disclosure will be described in detail below with reference to the accompanying drawings.

FIGS. 3 to 18A-18B illustrate structures corresponding to certain stages during an exemplary fabrication process of a semiconductor structure consistent with various disclosed embodiments of the present disclosure.

Figure 19:
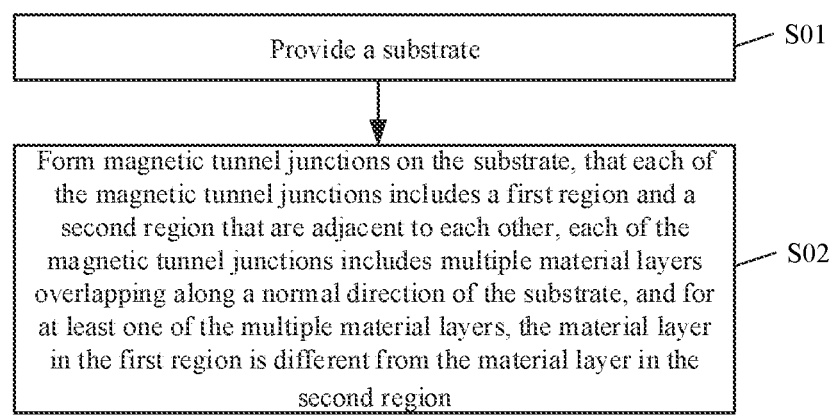
FIG. 19 illustrates an exemplary fabrication process of a semiconductor structure consistent with various disclosed embodiments of the present disclosure.

FIG. 19 illustrates an exemplary fabrication process of a semiconductor structure consistent with various disclosed embodiments of the present disclosure.

Figure 3:
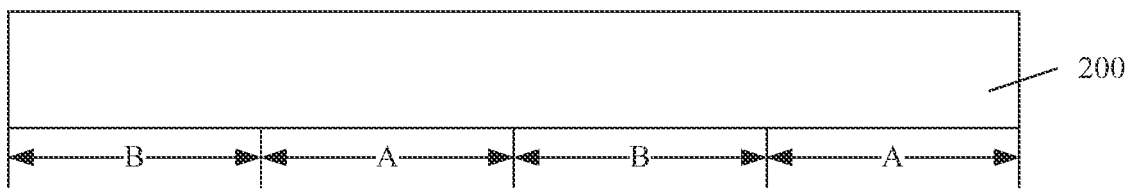

Referring to FIG. 3, a substrate 200 is provided, according to S01 in FIG. 19.

In one embodiment, the substrate 200 includes a plurality of initial first regions A and an initial second region B, the initial second region B being adjacent to an initial first region A.

In one embodiment, the substrate 200 includes a base substrate (not shown in FIG. 2) and a device layer (not shown in FIG. 2) on the base substrate. The device layer may include a device structure, for example, a PMOS transistor, an NMOS transistor. The device layer may further include an interconnection structure electrically connected to the device structure, and an insulating layer surrounding the device structure and the interconnection structure.

The substrate 200 is made of a material including a semiconductor material. In one embodiment, the substrate 200 is made of a material including silicon. In other embodiments, the substrate is made of a material including silicon carbide, silicon germanium, a compound semiconductor material composed of III-V group elements, silicon-on-insulator (SOI), germanium-on-insulator, or a combination thereof. The compound semiconductor material composed of III-V group elements includes InP, GaAs, GaP, InAs, InSb, InGaAs, InGaAsP, or a combination thereof.

Next, magnetic tunnel junctions are formed on the substrate 200. Each of the magnetic tunnel junctions includes a first region and a second region adjacent to the first region, each of the magnetic tunnel junctions includes a multilayered material including material layers stacked along a normal direction of the substrate 200, and the material layers of each magnetic tunnel junction include at least one material layer that is different in the first region and the second region. In one embodiment, the multilayered material includes: a lower electrode layer over the substrate 200, a seed layer over the lower electrode layer, a first electromagnetic layer over the seed layer, an insulating layer over the first electromagnetic layer, a second electromagnetic layer over the insulating layer, an optimized layer over the second electromagnetic layer, and an upper electrode layer over the optimized layer. FIG. 4 to FIGS. 18A-18B can be referred to for alternative processes to form the magnetic tunnel junctions.

Figure 4:
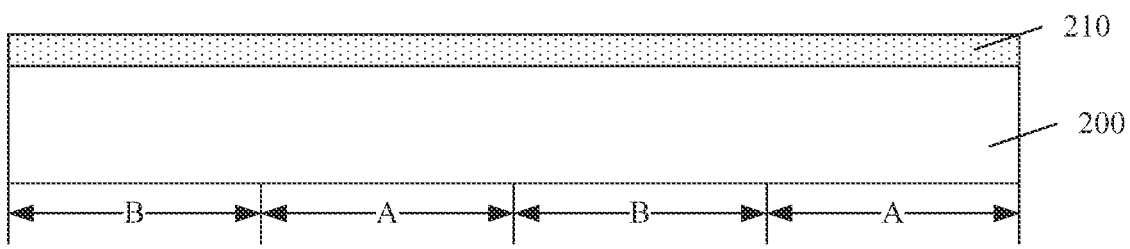

Referring to FIG. 4, a lower electrode material film 210 is formed on the substrate 200.

A formation process of the lower electrode material film 210 includes a physical vapor deposition process or a chemical vapor deposition process.

The lower electrode material film 210 is made of a material including titanium, tantalum, platinum, copper, tungsten, aluminum, titanium nitride, tantalum nitride, tungsten silicide, or a combination thereof.

In one embodiment, the lower electrode material film 210 is made of a material including tungsten.

In one embodiment, the lower electrode material film 210 on the initial first regions A is the same as the lower electrode material film 210 on the initial second region B.

In other embodiments, the method for forming the semiconductor structure further includes: performing a modification treatment to the lower electrode material film, so that the lower electrode material film on the initial first regions is different from the lower electrode material film on the initial second region.

In one embodiment, a thickness of the lower electrode material film on the initial first regions is different from a thickness of the lower electrode material film on the initial second region.

In another embodiment, a roughness of the lower electrode material film on the initial first regions is different from a roughness of the lower electrode material film on the initial second region.

In another embodiment, the lower electrode material film on the initial first regions is made of a material including tungsten, and the lower electrode material film on the initial second region is made of a material including tungsten doped with sixth modifying ions, the sixth modifying ions including titanium ions, tantalum ions, or a combination thereof.

Figure 5:
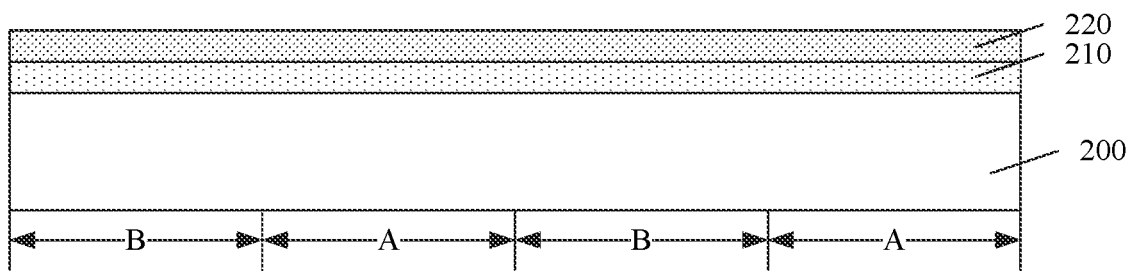

Referring to FIG. 5, a seed material film 220 is formed on the lower electrode material film 210.

The seed material film 220 can better lattice match with a subsequently formed upper electrode material film, thereby improving the performance of the formed magnetic tunnel junction.

A formation process of the seed material film 220 includes a physical vapor deposition process or a chemical vapor deposition process.

The seed material film 220 is made of a material including iron, cobalt, nickel, cobalt iron boron, cobalt iron, nickel iron, lanthanum strontium manganese oxygen, or a combination thereof.

In one embodiment, the seed material film 220 is made of a material including cobalt iron boron.

In one embodiment, the seed material film 220 on the initial first regions A is the same as the seed material film 220 on the initial second region B.

In other embodiments, the method for forming the semiconductor structure further includes: performing a modification treatment to the seed material film, so that the seed material film on the initial first regions is different from the seed material film on the initial second region.

In one embodiment, a thickness of the seed material film on the initial first regions is different from a thickness of the seed material film on the initial second region.

In another embodiment, a roughness of the seed material film on the initial first regions is different from a roughness of the seed material film on the initial second region.

In another embodiment, the seed material film on the initial first regions is made of a material including cobalt iron boron, and the seed material film on the initial second region is made of a material including cobalt iron boron doped with fourth modifying ions, the fourth modifying ions including titanium ions, tantalum ions, or a combination thereof.

Figure 6:
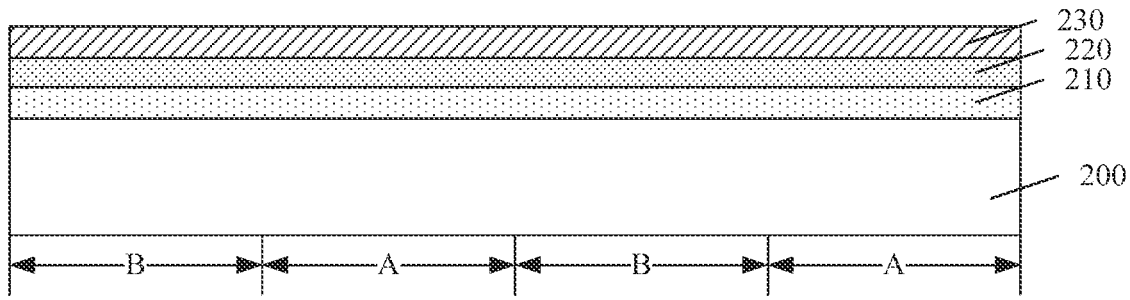

Referring to FIG. 6, a first electromagnetic material film 230 is formed on the seed material film 220.

A formation process of the first electromagnetic material film 230 includes a physical vapor deposition process or a chemical vapor deposition process.

The first electromagnetic material film 230 is made of a material including iron, cobalt, nickel, cobalt iron boron, cobalt iron, nickel iron, lanthanum strontium manganese oxygen, or a combination thereof.

In one embodiment, the first electromagnetic material film 230 is made of a material including cobalt iron boron.

Figure 7:
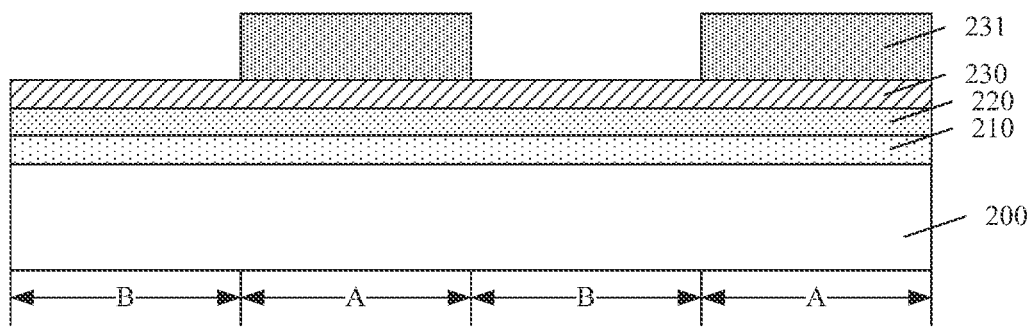
Figure 8:
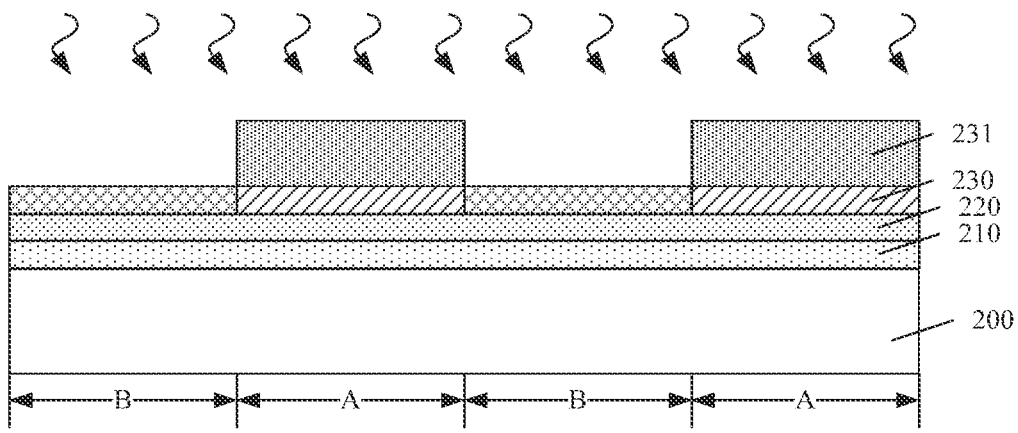

Next, a modification treatment is performed to the first electromagnetic material film 230. FIGS. 7 to 8 can be referred to for an alternative process of the modification treatment.

Referring to FIG. 7, a second patterned layer 231 is formed on the first electromagnetic material film 230; and the second patterned layer 231 exposes a surface of the first electromagnetic material film 230 on the initial first regions A or the initial second region B.

In one embodiment, the second patterned layer 231 exposes the surface of the first electromagnetic material film 230 on the initial second region B.

In other embodiments, the second patterned layer exposes the surface of the first electromagnetic material film on the initial first regions.

Referring to FIG. 8, the second patterned layer 231 is used as a mask to perform the modification treatment to the first electromagnetic material film 230.

The modification treatment includes a physical modification, a chemical modification, or a combination thereof.

In one embodiment, the modification treatment applied is the physical modification.

In one embodiment, a method of the physical modification is a plasma etching process, and process parameters of the plasma etching process include: a gas used including Ar, Xe, or Kr.

In one embodiment, after the plasma etching process, a thickness of the first electromagnetic material film 230 on the initial first regions A is different from a thickness of the first electromagnetic material film 230 on the initial second region B.

In other embodiments, the method of the physical modification is a chemical etching process, or the modification treatment may also be the chemical modification.

In another embodiment, after the modification treatment, a roughness of the first electromagnetic material film on the initial first regions is different from a roughness of the first electromagnetic material film on the initial second region.

In another embodiment, after the modification treatment, the first electromagnetic material film on the initial first regions is made of a material including cobalt iron boron, and the first electromagnetic material film on the initial second region is made of a material including cobalt iron boron doped with first modifying ions, the first modifying ions including titanium ions, tantalum ions, or a combination thereof.

In one embodiment, after the modification treatment to the first electromagnetic material film 230, the second patterned layer 231 is removed.

In other embodiments, the modification treatment may not be performed to the first electromagnetic material film, and the first electromagnetic material film on the initial first regions is the same as the first electromagnetic material film on the initial second region.

Figure 9:
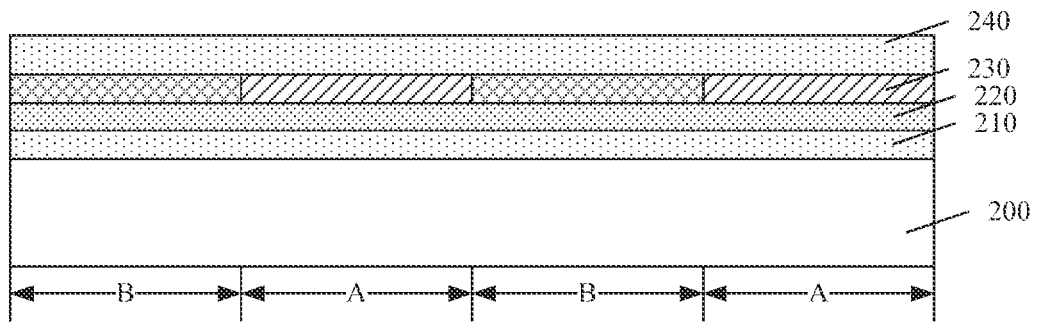

Referring to FIG. 9, an insulating material film 240 is formed on the first electromagnetic material film 230.

A formation process of the insulating material film 240 includes a physical vapor deposition process or a chemical vapor deposition process.

The insulating material film 240 is made of a material including magnesium oxide, aluminum oxide, silicon nitride, silicon oxynitride, hafnium dioxide, zirconium dioxide, or a combination thereof.

In one embodiment, the insulating material film 240 is made of a material including magnesium oxide.

Figure 10:
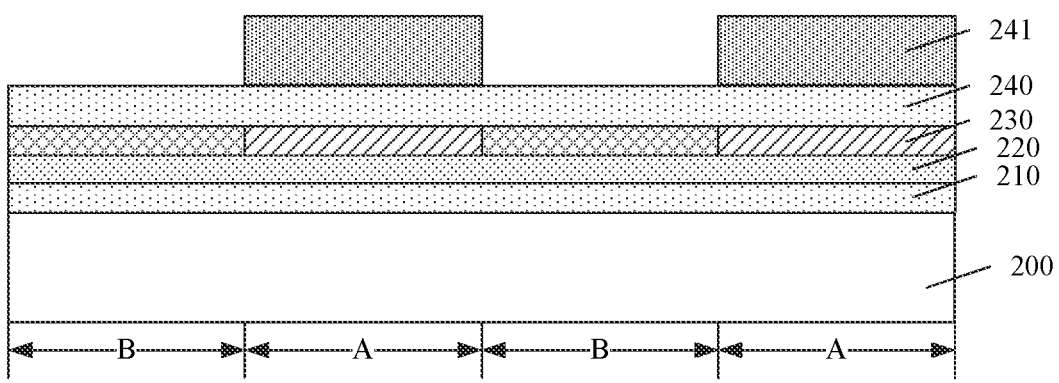
Figure 11:
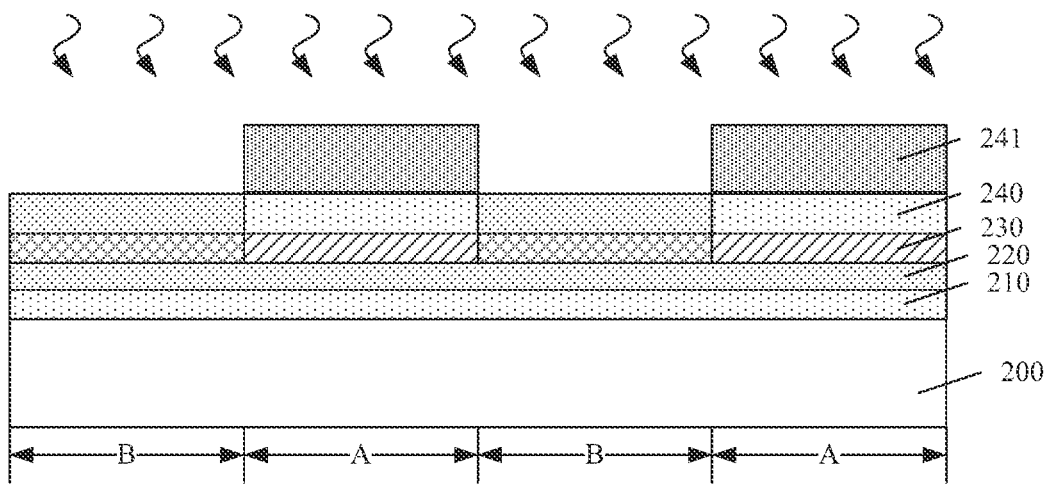

Next, a modification treatment is performed to the insulating material film 240. FIGS. 10 to 11 can be referred to for an alternative process of the modification treatment.

Referring to FIG. 10, a third patterned layer 241 is formed on the insulating material film 240; and the third patterned layer 241 exposes a surface of the insulating material film on the initial first regions A or the initial second region B.

In one embodiment, the third patterned layer 241 exposes the surface of the insulating material film on the initial second region B.

In other embodiments, the third patterned layer exposes the surface of the insulating material film on the initial first regions.

Referring to FIG. 11, the third patterned layer 241 is used as a mask to perform the modification treatment to the insulating material film 240.

The modification treatment includes a physical modification, a chemical modification, or a combination thereof.

In one embodiment, the modification treatment applied is the physical modification.

In one embodiment, a method of the physical modification is a chemical etching process, and parameters of the chemical etching process include: a low-concentration acid solution, that the acid solution includes: hydrochloric acid.

In other embodiments, the modification treatment may also be the chemical modification.

In one embodiment, after the chemical etching process, a thickness of the insulating material film 240 on the initial first regions A is different from a thickness of the insulating material film 240 on the initial second region B.

In other embodiments, the method of the physical modification is the chemical etching process, or the modification treatment may also be the chemical modification.

In one embodiment, after the modification treatment, a roughness of the insulating material film on the initial first regions is different from a roughness of the insulating material film on the initial second region.

In another embodiment, after the modification treatment, the insulating material film on the initial first regions is made of a material including magnesium oxide, and the insulating material film on the initial second region is made of a material including magnesium oxide doped with second modifying ions, the second modifying ions including: nitrogen ions, magnesium ions, or a combination thereof.

In one embodiment, after the modification treatment to the insulating material film 240, the third patterned layer 241 is removed.

In other embodiments, the modification treatment may not be performed to the insulating material film, and the insulating material film on the initial first regions is the same as the insulating material film on the initial second region.

Figure 12:
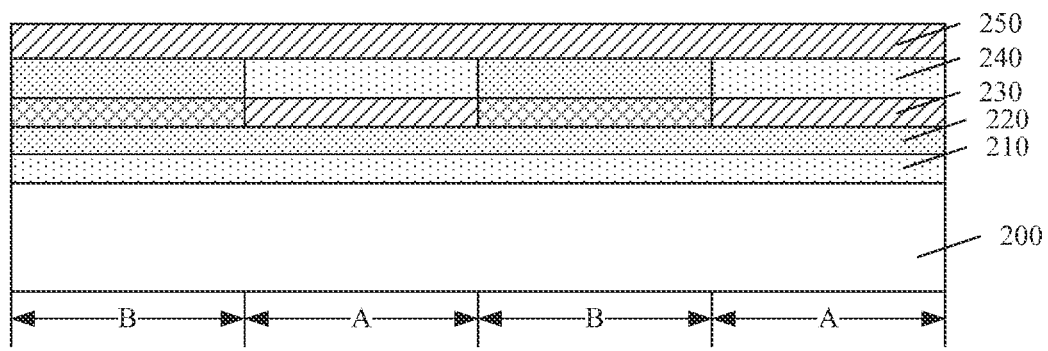

Referring to FIG. 12, a second electromagnetic material film 250 is formed on the insulating material film 240.

A formation process of the second electromagnetic material film 250 is a physical vapor deposition process or a chemical vapor deposition process.

The second electromagnetic material film 250 is made of a material including iron, cobalt, nickel, cobalt iron boron, cobalt iron, nickel iron, lanthanum strontium manganese oxygen, or a combination thereof.

In one embodiment, the second electromagnetic material film 250 is made of a material including cobalt iron boron.

Figure 13:
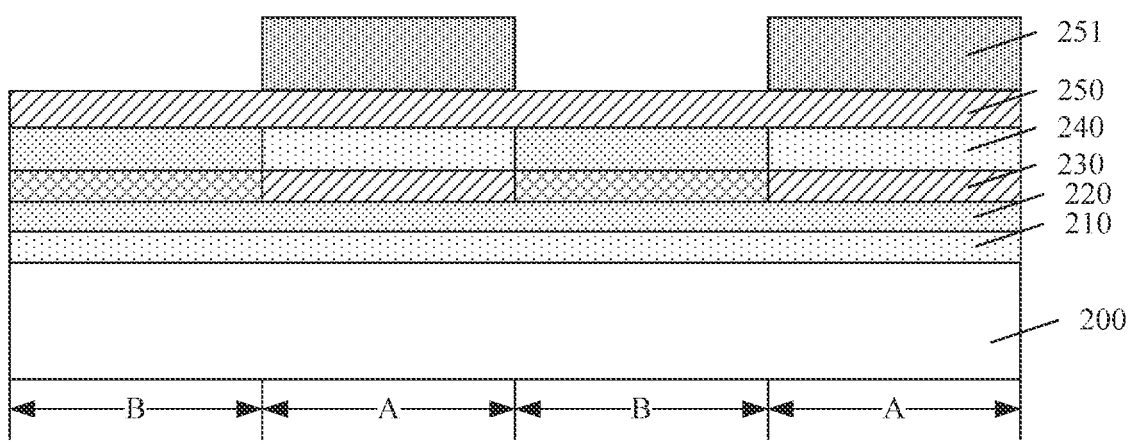
Figure 14:
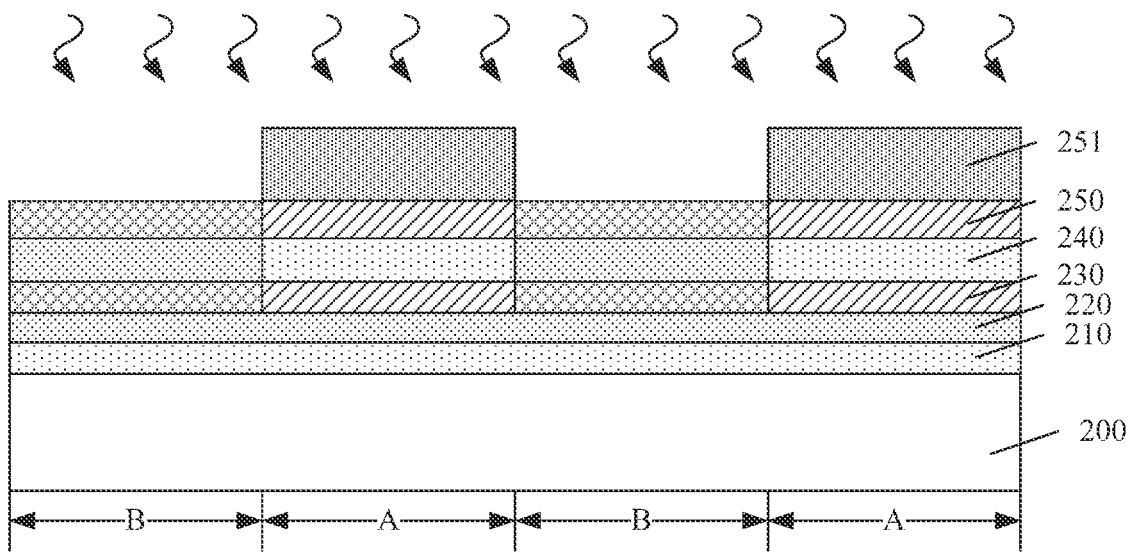

Next, a modification treatment is performed to the second electromagnetic material film 250. FIGS. 13 to 14 can be referred to for an alternative process of the modification treatment.

Referring to FIG. 13, a fourth patterned layer 251 is formed on the second electromagnetic material film 250; and the fourth patterned layer 251 exposes a surface of the second electromagnetic material film 250 on the initial first regions A or the initial second region B.

In one embodiment, the fourth patterned layer 251 exposes the surface of the second electromagnetic material film 250 on the initial second region B.

In other embodiments, the fourth patterned layer exposes the surface of the second electromagnetic material film on the initial first regions.

Referring to FIG. 14, the fourth patterned layer 251 is used as a mask to perform the modification treatment to the second electromagnetic material film 250.

The modification treatment includes a physical modification, a chemical modification, or a combination thereof.

In one embodiment, the modification treatment applied is the chemical modification.

In one embodiment, a method of the chemical modification is a plasma doping treatment, and doping ions include titanium ions, tantalum ions, or a combination thereof.

In one embodiment, after the plasma doping treatment, the second electromagnetic material film 250 on the initial first regions A is made of a material including cobalt iron boron, and the second electromagnetic material film 250 on the initial second region B is made of a material including cobalt iron boron doped with third modifying ions, the third modifying ions being titanium ions.

In another embodiment, the method of the chemical modification is a chemical solution treatment. A solution used for the chemical modification is a hydrogen peroxide solution, the second electromagnetic material film on the initial first regions is made of a material including cobalt iron boron, and the second electromagnetic material film on the initial second region is made of a material including partially oxidized oxygen-containing cobalt iron boron.

In other embodiments, the modification treatment may also be the physical modification, and the physical modification includes a plasma etching process or a chemical etching process.

In another embodiment, after the modification treatment, a roughness of the second electromagnetic material film on the initial first regions is different from a roughness of the second electromagnetic material film on the initial second region.

In another embodiment, after the modification treatment, a thickness of the second electromagnetic material film on the initial first regions is different from a thickness of the second electromagnetic material film on the initial second region.

In one embodiment, after the modification treatment to the second electromagnetic material film 250, the fourth patterned layer 251 is removed.

In other embodiments, the modification treatment may not be performed to the second electromagnetic material film, and the second electromagnetic material film on the initial first regions is the same as the second electromagnetic material film on the initial second region.

Figure 15:
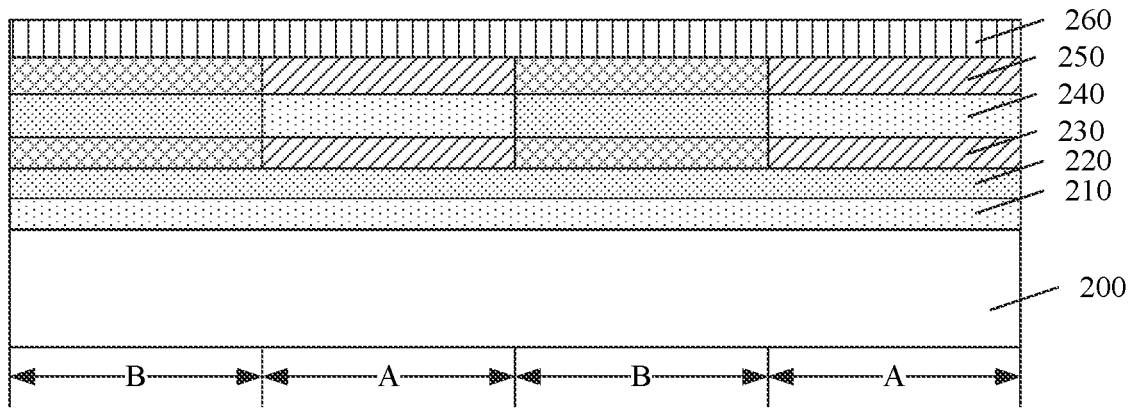

Referring to FIG. 15, an optimized material film 260 is formed on the second electromagnetic material film 250.

The optimized material film 260 can better lattice match with the second electromagnetic material film 250, thereby improving the performance of the formed magnetic tunnel junctions.

A formation process of the optimized material film 260 includes a physical vapor deposition process or a chemical vapor deposition process.

The optimized material film 260 is made of a material including magnesium oxide, aluminum oxide, silicon nitride, silicon oxynitride, hafnium dioxide, zirconium dioxide, or a combination thereof.

In one embodiment, the optimized material film 260 is made of a material including magnesium oxide. In one embodiment, the optimized material film 260 on the initial first regions A is the same as the optimized material film 260 on the initial second region B.

In other embodiments, the method for forming the semiconductor structure further includes: performing a modification treatment to the optimized material film, so that the optimized material film on the initial first regions is different from the optimized material film on the initial second region.

In one embodiment, a thickness of the optimized material film on the initial first regions is different from a thickness of the optimized material film on the initial second region.

In another embodiment, a roughness of the optimized material film on the initial first regions is different from a roughness of the optimized material film on the initial second region.

In another embodiment, the optimized material film on the initial first regions is made of a material including magnesium oxide, and the optimized material film on the initial second region is made of a material including magnesium oxide doped with fifth modifying ions, the fifth modifying ions including magnesium ions, nitrogen ions, or a combination thereof.

Figure 16:
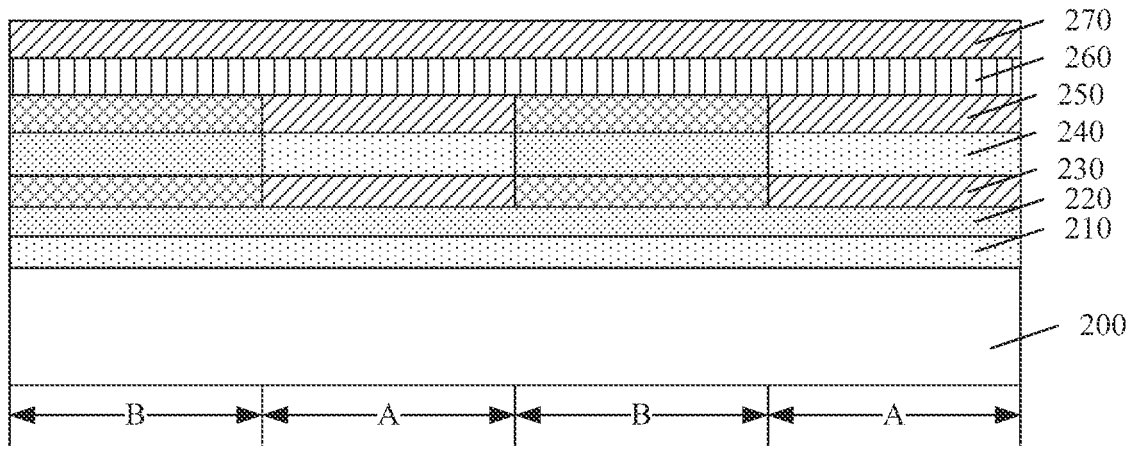

Referring to FIG. 16, an upper electrode material film 270 is formed on the optimized material film 260.

A formation process of the upper electrode material film 270 includes a physical vapor deposition process or a chemical vapor deposition process.

The upper electrode material film 270 is made of a material including titanium, tantalum, platinum, copper, tungsten, aluminum, titanium nitride, tantalum nitride, tungsten silicide, or a combination thereof.

In one embodiment, the upper electrode material film 270 is made of a material including tungsten.

In one embodiment, the upper electrode material film 270 on the initial first regions A is the same as the upper electrode material film 270 on the initial second region.

In other embodiments, the method for forming the semiconductor structure further includes: performing a modification treatment to the upper electrode material film, so that the upper electrode material film on the initial first regions is different from the upper electrode material film on the initial second region.

In one embodiment, a thickness of the upper electrode material film on the initial first regions is different from a thickness of the upper electrode material film on the initial second region.

In another embodiment, a roughness of the upper electrode material film on the initial first regions is different from a roughness of the upper electrode material film on the initial second region.

In another embodiment, the upper electrode material film on the initial first regions is made of a material including tungsten, and the upper electrode material film on the initial second region is made of a material including tungsten doped with seventh modifying ions, the seventh modifying ions including titanium ions, tantalum ions, or a combination thereof.

Then, using a patterning process, the first electromagnetic material film 230, the insulating material film 240, and the second electromagnetic material film 250 are etched until a surface of the substrate 200 is exposed, to form the magnetic tunnel junctions on the substrate 200, according to S02 in FIG. 19, that the first region of each of the magnetic tunnel junctions is located on a portion of one of the initial first regions A, and the second region of each of the magnetic tunnel junctions is located on a portion of the initial second region B. Each of the magnetic tunnel junctions includes: a first electromagnetic layer, an insulating layer over the first electromagnetic layer, and a second electromagnetic layer over the insulating layer. FIG. 17 to FIGS. 18A-18B can be referred to for an alternative process of the patterning process.

Figure 17:
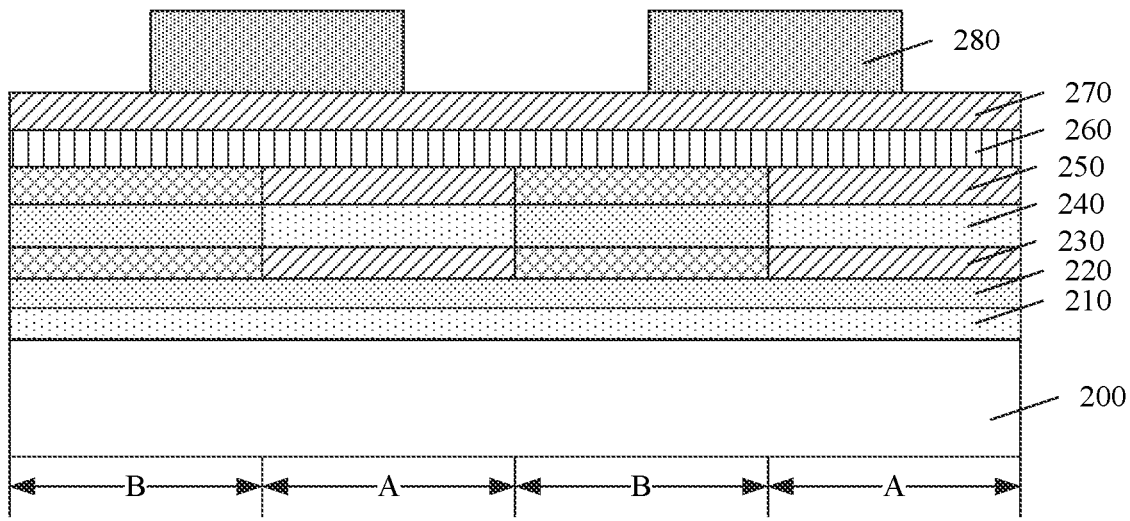

Referring to FIG. 17, a first patterned layer 280 is formed on the second electromagnetic material film 250, and the first patterned layer 280 exposes a portion of the second electromagnetic material film.

In one embodiment, the first patterned layer 280 exposes a surface of the upper electrode material film 270 on a portion of each of the initial first regions A and on a portion of the initial second region B, and the first patterned layer 280 covers the surface of the upper electrode material film 270 on a portion of each of the initial first regions A and a portion of the initial second region B.

Figure 18A:
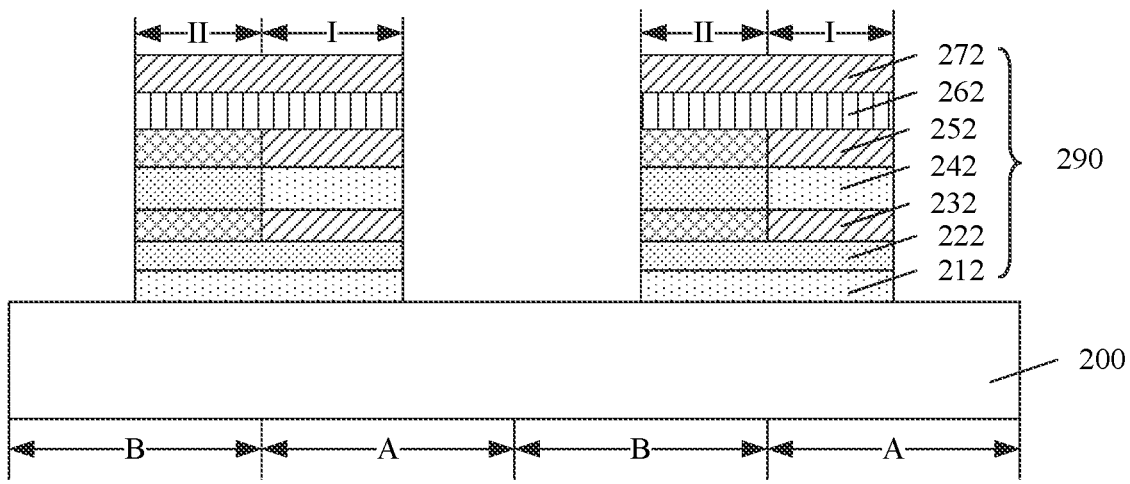

Referring to FIG. 18A, the first patterned layer 280 is used as a mask, and the first electromagnetic material film 230, the insulating material film 240, and the second electromagnetic material film 250 are etched until the surface of the substrate 200 is exposed.

In one embodiment, using the first patterned layer 280 as the mask, the lower electrode material film 210, the seed material film 220, the first electromagnetic material film 230, the insulating material film 240, the second electromagnetic material film 250, the optimized material film 260, and the upper electrode material film 270 are etched until the surface of the substrate 200 is exposed, so that the lower electrode material film 210 forms a lower electrode layer 212, the seed material film 220 forms a seed layer 222, the first electromagnetic material film 230 forms a first electromagnetic layer 232, the insulating material film 240 forms an insulating layer 242, the second electromagnetic material film 250 forms a second electromagnetic layer 252, the optimized material film 260 forms an optimized layer 262, and the upper electrode material film 270 forms an upper electrode layer 272, to form magnetic tunnel junctions 290 on the substrate 200. Each of the magnetic tunnel junctions 290 includes a first region I and a second region II adjacent to the first region I, that the first region I of each of the magnetic tunnel junctions 290 is located on a portion of one of the initial first regions A, and the second region II of each of the magnetic tunnel junctions 290 is located on a portion of the initial second region B.

Figure 18B:
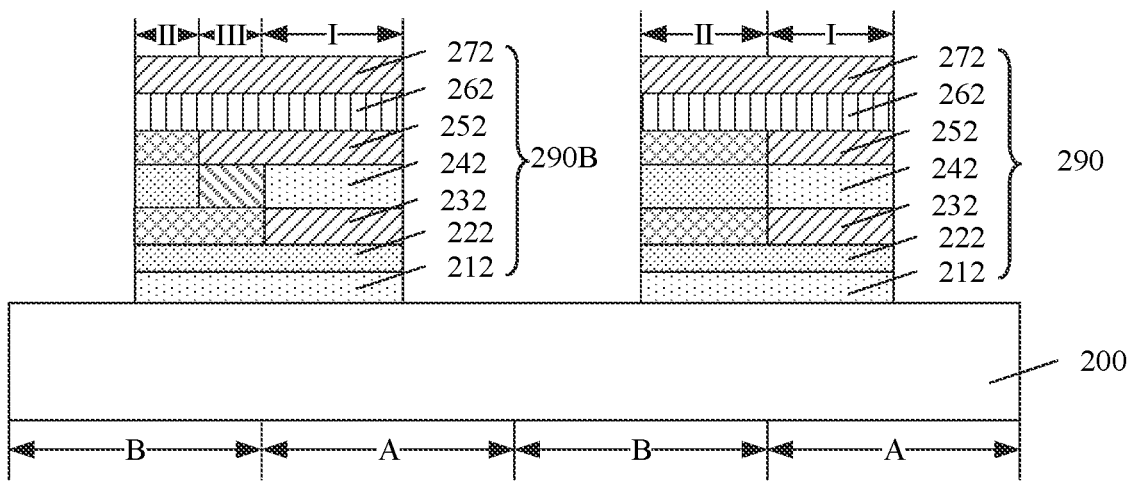

In other embodiments, each or one of the magnetic tunnel junctions further includes: a third region adjacent to the first region and the second region. At least one material layer of the magnetic tunnel junction is different in the first, second, and/or third regions. For example, as shown in FIG. 18B, an exemplary magnetic tunnel junction 290B includes a first region I, a second region IL, and a third region III. In the magnetic tunnel junction 290B, a second electromagnetic layer 252 in the second region II is different from the second electromagnetic layer 252 in the first region I and the third region III, an insulating layer 242 in all three regions is different from each other, and a first electromagnetic layer 232 in the first region I is different from the first electromagnetic layer 232 in the second region II and the third region III. In various embodiments, the first, second, and third regions may have substantially same width. For example, the third region may be centered between the first and second regions.

By forming the magnetic tunnel junctions 290 on the substrate 200, each of the magnetic tunnel junctions 290 includes the first region I and the second region II adjacent to the first region I, and the material layers of each magnetic tunnel junction include at least one material layer that is different in the first region I and the second region IL, so that the multilayered material on the first region I and the multilayered material on the second region have different high resistance values and low resistance values, respectively, and magnetoresistance between the first region I and the second region II is connected in parallel, so that each of the magnetic tunnel junctions 290 can form $2^n$ states (n is a natural number greater than 1), thereby effectively increasing the storage capacity of the memory cell, and increasing the capacity density of the formed semiconductor structure.

Correspondingly, the embodiments of the present disclosure also provide a semiconductor structure formed by the above method. Continuing to refer to FIG. 18A, a semiconductor structure includes: a substrate 200; and magnetic tunnel junctions 290 on the substrate 200. Each of the magnetic tunnel junctions 290 includes a first region I and a second region II adjacent to the first region I, each of the magnetic tunnel junctions 290 includes a multilayered material including material layers stacked along a normal direction of the substrate 200, and the material layers of each magnetic tunnel junction include at least one material layer that is different in the first region I and the second region II.

Since each of the magnetic tunnel junctions 290 includes the first region I and the second region II adjacent to the first region I, and the material layers of each magnetic tunnel junction include at least one material layer that is different in the first region I and the second region II, the multilayered material in the first region I and the multilayered material in the second region II respectively have different high resistance values and low resistance values, and the magnetoresistance between the first region I and the second region II is connected in parallel, so that each of the magnetic tunnel junctions 290 can form $2^n$ states (n is a natural number greater than 1), thereby effectively increasing the storage capacity of the memory cell, and increasing the capacity density of the formed semiconductor structure.

The at least one material layer is different in physical properties and/or chemical properties in the first region I and the second region II.

In other embodiments, each or one of the magnetic tunnel junctions further includes: a third region adjacent to the first region and the second region. At least one material layer of the magnetic tunnel junction is different in the first, second, and/or third regions.

In one embodiment, the multilayered material includes: a first electromagnetic layer 232, an insulating layer 242 over the first electromagnetic layer 232, and a second electromagnetic layer 252 over the insulating layer 242.

In one embodiment, a thickness of the first electromagnetic layer 232 in the first region I is different from a thickness of the first electromagnetic layer 232 in the second region II.

In another embodiment, a roughness of the first electromagnetic layer in the first region is different from a roughness of the first electromagnetic layer in the second region.

In another embodiment, the first electromagnetic layer in the first region is made of a material including cobalt iron boron, and the first electromagnetic layer in the second region is made of a material including cobalt iron boron doped with first modifying ions, the first modifying ions including titanium ions, tantalum ions, or a combination thereof.

In one embodiment, a thickness of the insulating layer 242 in the first region I is different from a thickness of the insulating layer 242 in the second region II.

In another embodiment, a roughness of the insulating layer in the first region is different from a roughness of the insulating layer in the second region.

In another embodiment, the insulating layer in the first region is made of a material including magnesium oxide, and the insulating layer in the second region is made of a material including magnesium oxide doped with second modifying ions, the second modifying ions including: nitrogen ions, magnesium ions, or a combination thereof.

In one embodiment, the second electromagnetic layer 252 in the first region I is made of a material including cobalt iron boron, and the second electromagnetic layer 252 in the second region II is made of a material including cobalt iron boron doped with third modifying ions, the third modifying ions including: titanium ions, tantalum ions, or a combination thereof.

In another embodiment, a thickness of the second electromagnetic layer in the first region is different from a thickness of the second electromagnetic layer in the second region.

In another embodiment, a roughness of the second electromagnetic layer in the first region is different from a roughness of the second electromagnetic layer in the second region.

In one embodiment, the multilayered material further includes: a seed layer 222 under the first electromagnetic layer 232.

In one embodiment, the seed layer 222 in the first region I is the same as the seed layer in the second region II.

In another embodiment, a thickness of the seed layer in the first region is different from a thickness of the seed layer in the second region.

In another embodiment, a roughness of the seed layer in the first region is different from a roughness of the seed layer in the second region.

In another embodiment, the seed layer in the first region is made of a material including cobalt iron boron, and the seed layer in the second region is made of a material including cobalt iron boron doped with fourth modifying ions, the fourth modifying ions including titanium ions, tantalum ions, or a combination thereof.

In one embodiment, the multilayered material further includes: an optimization layer 262 over the second electromagnetic layer 252.

In one embodiment, the optimized layer 262 in the first region I is the same as the optimized layer 262 in the second region II.

In other embodiments, a thickness of the optimized layer in the first region is different from a thickness of the optimized layer in the second region.

In another embodiment, a roughness of the optimized layer in the first region is different from a roughness of the optimized layer in the second region.

In another embodiment, the optimized layer in the first region is made of a material including magnesium oxide, and the optimized layer in the second region is made of a material including magnesium oxide doped with fifth modifying ions, the fifth modifying ions including: magnesium ions, nitrogen ions, or a combination thereof.

In one embodiment, the multilayered material further includes: a lower electrode layer 212 under the first electromagnetic layer 232, and an upper electrode layer 272 over the second electromagnetic layer 252.

Alternatively, in one embodiment, the seed layer 222 is over the lower electrode layer 212, and the upper electrode layer 272 is over the optimized layer 262.

In one embodiment, the lower electrode layer 212 in the first region I is the same as the lower electrode layer 212 in the second region II.

In another embodiment, a thickness of the lower electrode layer in the first region is different from a thickness of the lower electrode layer in the second region.

In another embodiment, a roughness of the lower electrode layer in the first region is different from a roughness of the lower electrode layer in the second region.

In another embodiment, the lower electrode layer in the first region is made of a material including tungsten, and the lower electrode layer in the second region is made of a material including tungsten doped with sixth modifying ions, the sixth modifying ions including: titanium ions, tantalum ions, or a combination thereof.

In one embodiment, the upper electrode layer 272 in the first region I is the same as the upper electrode layer 272 in the second region II.

In other embodiments, a thickness of the upper electrode layer in the first region is different from a thickness of the upper electrode layer in the second region.

In another embodiment, a roughness of the upper electrode layer in the first region is different from a roughness of the upper electrode layer in the second region.

In another embodiment, the upper electrode layer in the first region is made of a material including tungsten, and the upper electrode layer in the second region is made of a material including tungsten doped with seventh modifying ions, the seventh modifying ions including: titanium ions, tantalum ions, or a combination thereof.

The embodiments disclosed herein are exemplary only. Other applications, advantages, alternations, modifications, or equivalents to the disclosed embodiments that are obvious to those skilled in the art are intended to be encompassed within the scope of the present disclosure.

What is claimed is:
1. A semiconductor structure, comprising:
a substrate; and
magnetic tunnel junctions on the substrate, wherein:
each magnetic tunnel junction of the magnetic tunnel junctions includes a first region and a second region adjacent to the first region, the first region and the second region being coplanar with each other;

each magnetic tunnel junction includes a multilayered material including material layers stacked along a normal direction of the substrate, the material layered being stacked at both the first region and the second region, and the multilayered material including a first electromagnetic layer, an insulating layer over the first electromagnetic layer, and a second electromagnetic layer over the insulating layer;

the material layers of each magnetic tunnel junction include at least one material layer that is different in the first region and the second region, the at least one material layer at the second region being made of a material with doping ions, and the at least one material layer at the first region being made of the material without the doping ions;

the first electromagnetic layer in the first region is made of a material including cobalt iron boron without the doping ions, and the first electromagnetic layer in the second region is made of a material including cobalt iron boron doped with first modifying ions, the first modifying ions including titanium ions, tantalum ions, or a combination thereof;

the second electromagnetic layer in the first region is made of a material including cobalt iron boron without the doping ions, and the second electromagnetic layer in the second region is made of a material including cobalt iron boron doped with second modifying ions, the second modifying ions including titanium ions, tantalum ions, or a combination thereof; and the multilayered material further includes:
  a seed layer covering a bottom surface of the first electromagnetic layer in both the first region and the second region, the seed layer being made of a material including cobalt iron boron;
  an optimized layer covering a top surface of the second electromagnetic layer in both the first region and the second region, the optimized layer being made of a material including cobalt iron boron;
  a lower electrode layer covering a bottom surface of the seed layer and on a top surface of the substrate; and
  an upper electrode layer covering a top surface of the optimized layer.

2. The semiconductor structure according to claim 1, wherein:
the at least one material layer is different in physical properties and/or chemical properties in the first region and the second region.

3. The semiconductor structure according to claim 1, wherein:
a thickness of the first electromagnetic layer in the first region is different from a thickness of the first electromagnetic layer in the second region; or
a roughness of the first electromagnetic layer in the first region is different from a roughness of the first electromagnetic layer in the second region.

4. The semiconductor structure according to claim 1, wherein:
a thickness of the insulating layer in the first region is different from a thickness of the insulating layer in the second region;

a roughness of the insulating layer in the first region is different from a roughness of the insulating layer in the second region; or
the insulating layer in the first region is made of a material including magnesium oxide, and the insulating layer in the second region is made of a material including magnesium oxide doped with third modifying ions, the third modifying ions including nitrogen ions, magnesium ions, or a combination thereof.

5. The semiconductor structure according to claim 1, wherein:
a thickness of the second electromagnetic layer in the first region is different from a thickness of the second electromagnetic layer in the second region; or
a roughness of the second electromagnetic layer in the first region is different from a roughness of the second electromagnetic layer in the second region.

6. The semiconductor structure according to claim 1, wherein:
a thickness of the seed layer in the first region is different from a thickness of the seed layer in the second region;
a roughness of the seed layer in the first region is different from a roughness of the seed layer in the second region;
the seed layer in the first region is made of a material including cobalt iron boron, and the seed layer in the second region is made of a material including cobalt iron boron doped with fourth modifying ions, the fourth modifying ions including titanium ions, tantalum ions, or a combination thereof;
a thickness of the optimized layer in the first region is different from a thickness of the optimized layer in the second region;
a roughness of the optimized layer in the first region is different from a roughness of the optimized layer in the second region; or
the optimized layer in the first region is made of a material including cobalt iron boron, and the optimized layer in the second region is made of a material including cobalt iron boron doped with fifth modifying ions, the fifth modifying ions including nitrogen ions, magnesium ions, or a combination thereof.

7. The semiconductor structure according to claim 1, wherein:
a thickness of the lower electrode layer in the first region is different from a thickness of the lower electrode layer in the second region;
a roughness of the lower electrode layer in the first region is different from a roughness of the lower electrode layer in the second region;
the lower electrode layer in the first region is made of a material including a metal, and the lower electrode layer in the second region is made of a material including a metal doped with sixth modifying ions, the sixth modifying ions including titanium ions, tantalum ions, or a combination thereof;
a thickness of the upper electrode layer in the first region is different from a thickness of the upper electrode layer in the second region;
a roughness of the upper electrode layer in the first region is different from a roughness of the upper electrode layer in the second region; or
the upper electrode layer in the first region is made of a material including a metal, and the upper electrode layer in the second region is made of a material including a metal doped with seventh modifying ions, the seventh modifying ions including titanium ions, tantalum ions, or a combination thereof.

8. The semiconductor structure according to claim 1, wherein:
   each magnetic tunnel junction of the magnetic tunnel junctions further includes: a third region adjacent to the first region and the second region, and the material layers of each magnetic tunnel junction include at least one material layer that is different in the first, second, and/or third regions.

9. A method for forming a semiconductor structure, comprising:
   providing a substrate; and
   forming magnetic tunnel junctions on the substrate, wherein:
      each magnetic tunnel junction of the magnetic tunnel junctions includes a first region and a second region adjacent to the first region, the first region and the second region being coplanar with each other;
      each magnetic tunnel junction includes a multilayered material including material layers stacked along a normal direction of the substrate, the material layered being stacked at both the first region and the second region, and the multilayered material including a first electromagnetic layer, an insulating layer over the first electromagnetic layer, and a second electromagnetic layer over the insulating layer; and
      the material layers of each magnetic tunnel junction include at least one material layer that is different in the first region and the second region, the at least one material layer at the second region being made of a material with doping ions, and the at least one material layer at the first region being made of the material without the doping ions;
      the first electromagnetic layer in the first region is made of a material including cobalt iron boron without the doping ions, and the first electromagnetic layer in the second region is made of a material including cobalt iron boron doped with first modifying ions, the first modifying ions including titanium ions, tantalum ions, or a combination thereof;
      the second electromagnetic layer in the first region is made of a material including cobalt iron boron without the doping ions, and the second electromagnetic layer in the second region is made of a material including cobalt iron boron doped with second modifying ions, the second modifying ions including titanium ions, tantalum ions, or a combination thereof; and
      the multilayered material further includes:
         a seed layer covering a bottom surface of the first electromagnetic layer in both the first region and the second region, the seed layer being made of a material including cobalt iron boron;
         an optimized layer covering a top surface of the second electromagnetic layer in both the first region and the second region, the optimized layer being made of a material including cobalt iron boron;
         a lower electrode layer covering a bottom surface of the seed layer and on a top surface of the substrate; and
         an upper electrode layer covering a top surface of the optimized layer.

10. The method according to claim 9, wherein:
    the substrate includes a plurality of initial first regions and an initial second region between adjacent initial first regions, the initial second region being adjacent to an initial first region; and
    a method for forming the multilayered material includes:
       forming a first electromagnetic material film on the plurality of initial first regions and the initial second region;
       forming an insulating film on the first electromagnetic material film;
       forming a second electromagnetic material film on the insulating material film; and
       using a patterning process to etch the first electromagnetic material film, the insulating material film, and the second electromagnetic material film until a surface of the substrate is exposed, thereby forming the magnetic tunnel junctions on the substrate,
    wherein a first region of each of the magnetic tunnel junctions is located on a portion of one of the plurality of initial first regions, a second region of each of the magnetic tunnel junctions is located on a portion of the initial second region, and each of the magnetic tunnel junctions includes: a first electromagnetic layer, an insulating layer over the first electromagnetic layer, and a second electromagnetic layer over the insulating layer.

11. The method according to claim 10, wherein:
    the patterning process includes:
       forming a first patterned layer on the second electromagnetic material film, wherein the first patterned layer exposes a portion of the second electromagnetic material film; and
       using the first patterned layer as a mask, to etch the first electromagnetic material film, the insulating material film, and the second electromagnetic material film until the surface of the substrate is exposed.

12. The method according to claim 10, wherein:
    the method for forming the multilayered material further includes:
       performing a modification treatment to at least one of the first electromagnetic material film, the insulating material film, or the second electromagnetic material film, wherein:
          the modification treatment includes: forming a second patterned layer on the first electromagnetic material film, wherein the second patterned layer exposes a surface of the first electromagnetic material film on the plurality of initial first regions or the initial second region; and using the second patterned layer as a mask, to perform the modification treatment to the first electromagnetic material film;
          the modification treatment includes: forming a third patterned layer on the insulating material film, wherein the third patterned layer exposes a surface of the insulating material film on the plurality of initial first regions or the initial second region; and using the third patterned layer as a mask, to perform the modification treatment to the insulating material film; or
          the modification treatment includes: forming a fourth patterned layer on the second electromagnetic material film, wherein the fourth patterned layer exposes a surface of the second electromagnetic material film on the plurality of initial first regions or the initial second region; and using the fourth patterned layer as a mask, to perform the modification treatment to the second electromagnetic material film.

13. The method according to claim 12, wherein:
the modification treatment includes: a physical modification, a chemical modification, or a combination thereof, wherein:
- the physical modification includes a plasma etching process;
- the physical modification includes a chemical etching process;
- the chemical modification includes a plasma doping treatment, wherein doping ions include titanium ions, magnesium ions, nitrogen ions, magnesium ions, or a combination thereof; or
- the chemical modification includes a chemical solution treatment.

14. The method according to claim 10, wherein:
the method for forming the multilayered material further includes:
- forming a seed material film on the substrate before forming the first electromagnetic material film, wherein the seed material film is also etched during the patterning process to form the seed layer in the first region and the second region,
- after forming the second electromagnetic material film, forming an optimized material film on the second electromagnetic material film, wherein the optimized material film is also etched during the patterning process to form the optimized layer in the first region and the second region; or
- before forming the first electromagnetic material film, forming a lower electrode material film on the substrate; and after forming the second electromagnetic material film, forming an upper electrode material film on the second electromagnetic material film, wherein the lower electrode material film and the upper electrode material film are also etched during the patterning process, to form the lower electrode layer and the upper electrode layer in the first region and the second region, wherein the lower electrode layer is under the first electromagnetic layer, and the upper electrode layer is over the second electromagnetic layer.

15. The method according to claim 14, further comprising:
- after forming the seed material film and before the patterning process, performing a modification treatment to the seed material film, so that the seed material film on the plurality of initial first regions is different from the seed material film on the initial second region;
- after forming the optimized material film and before the patterning layer process, performing a modification treatment to the optimized material film, so that the optimized material film on the plurality of initial first regions is different from the optimized material film on the initial second region;
- performing a modification treatment to the lower electrode material film, so that the lower electrode material film on the plurality of initial first regions is different from the lower electrode material film on the initial second region; or
- performing a modification treatment to the upper electrode material film, so that the upper electrode material film on the plurality of initial first regions is different from the upper electrode material film on the initial second region.

16. The method according to claim 9, wherein:
each or one of the magnetic tunnel junctions further includes: a third region adjacent to the first region and the second region, and the material layers of the magnetic tunnel junction include at least one material layer that is different in the first, second, and/or third regions.

* * * * *